(12) United States Patent  
Gollier

(10) Patent No.: US 7,991,254 B2  
(45) Date of Patent: Aug. 2, 2011

(54) OPTICAL PACKAGE WITH MULTI-COMPONENT MOUNTING FRAME

(75) Inventor: Jacques Gollier, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 350 days.

(21) Appl. No.: 12/419,550

(22) Filed: Apr. 7, 2009

(65) Prior Publication Data

US 2010/0254654 A1 Oct. 7, 2010

(51) Int. Cl.
*G02B 6/32* (2006.01)
*G02B 26/00* (2006.01)
*G02F 1/01* (2006.01)

(52) U.S. Cl. ............................ 385/33; 385/147; 359/239

(58) Field of Classification Search ................. 385/15, 385/24, 31, 33, 80, 147; 359/237, 239, 238
See application file for complete search history.

(56) References Cited

U.S. PATENT DOCUMENTS

| | | | |
|---|---|---|---|
| 5,049,762 A | 9/1991 | Katoh | |
| 5,499,107 A | 3/1996 | Kuroda | |
| 6,611,643 B2 * | 8/2003 | Birk et al. | 385/33 |
| 6,668,103 B2 * | 12/2003 | Hosoi | 385/2 |
| 7,668,421 B2 * | 2/2010 | Nagai et al. | 385/33 |
| 7,830,473 B2 * | 11/2010 | Furuya et al. | 349/61 |
| 2007/0091411 A1 | 4/2007 | Mori et al. | |
| 2008/0243272 A1 | 10/2008 | Shibatani | |

* cited by examiner

*Primary Examiner* — Akm Ullah
(74) *Attorney, Agent, or Firm* — Kwadjo Adusei-Poku

(57) ABSTRACT

An optical package is provided comprising a laser diode, coupling optics, a wavelength conversion device, and a multi-component mounting frame. The coupling optics comprises a first lens component that creates a virtual magnified image V of the waveguide of one of the opposing facets with a magnification factor M1 and a second lens component that creates a focused image of V at the remaining opposing facet with a magnification factor M2. The virtual magnified image V is outside of the interfacial waveguide-to-waveguide optical path of the package and the multi-component mounting frame comprises first and second frame components that independently fix the relative alignment of the first and second lens components. The first and second frame components are secured to each other such that angular misalignment between the first and second frame components originates along a fixation interface H that is outside of the interfacial waveguide-to-waveguide optical path. The virtual magnified image V and the fixation interface H are both positioned on a common side of the coupling optics, either the laser diode side of the coupling optics or the wavelength conversion device side of the coupling optics. Additional embodiments are disclosed and claimed.

20 Claims, 4 Drawing Sheets

OPTICAL PACKAGE WITH MULTI-COMPONENT MOUNTING FRAME

BACKGROUND

The present disclosure generally relates to optical packages incorporating semiconductor lasers and complementary optical components to be optically aligned with the semiconductor laser. More specifically, the present disclosure relates to optical package designs for enhancing the optical alignment of a semiconductor laser and an associated wavelength conversion device. More generally, the present disclosure relates to any optical package where it is necessary to align the waveguides of two different optical components, which components may include a semiconductor laser, a wavelength conversion device, or any optical component including an optical waveguide.

BRIEF SUMMARY

Short wavelength light sources can be formed by combining a single-wavelength semiconductor laser, such as an infrared or near-infrared distributed feedback (DFB) laser, distributed Bragg reflector (DBR) laser, or Fabry-Perot laser, with a light wavelength conversion device, such as a second or third harmonic generation crystal. Typically, the crystal is used to generate higher harmonic waves of the fundamental laser signal. To do so, the lasing wavelength is preferably tuned to the spectral center of the crystal and the output of the laser is optically aligned with the waveguide portion of the crystal at the input face of the crystal.

Waveguide optical mode field diameters of typical second harmonic generation (SHG) crystals, such as MgO-doped periodically poled lithium niobate (PPLN) crystals can be very small, i.e, on the order of a few microns. It can be very challenging to properly align a beam spot from a laser diode with the waveguide portion of the input face of the SHG crystal. The respective positions of the laser, the coupling optics, the crystal, etc., can each play a role in the optical alignment of an optical package.

Generally, when sub-micron alignment tolerances are required in the alignment of optical waveguides of a particular optical package, two different fixation methods can be considered—cured epoxy fixation and laser welding. In cured epoxy fixation, package elements can be set in position by using, for example, a UV curing epoxy but this fixation method can be very sensitive to external factors such as humidity and temperature variations. Therefore, such fixation methods are usually not compatible with sub-micron stability. In laser welding, which is known to be relatively insensitive to external factors, thermal dissipation during the welding process causes components to move slightly during the welding operation. This post weld shifting makes it very hard to achieve sub-micron alignment tolerances. Further, relatively complex additional operations such as laser hammering are often needed to compensate for the post weld shift.

The present inventor has therefore recognized the need for creating designs such that the last fixation step is performed at a position where the lateral alignment tolerances are significantly relaxed. In accordance with one embodiment, an optical package is provided comprising a laser diode, coupling optics, a wavelength conversion device, and a multi-component mounting frame. The coupling optics comprises a first lens component that creates a virtual magnified image V of the waveguide of one of the opposing facets with a magnification factor M1 and a second lens component that creates a focused image of V at the remaining opposing facet with a magnification factor M2. The first and second frame components are secured to each other such that angular misalignment between the first and second frame components originates along a fixation interface H that is outside of the interfacial waveguide-to-waveguide optical path. The magnification factors M1 and M2 allow for the relaxation of lateral alignment tolerances in the optical package. The final alignment step can be executed at the fixation interface to eliminate or mitigate post weld shift or epoxy related instability. In addition, the approach described herein can significantly increase angular alignment tolerances at the fixation interface. By setting the mounting interface close to the virtual image V or its optical equivalent, the aforementioned angular tolerances can be significantly relaxed.

The virtual magnified image V is outside of the interfacial waveguide-to-waveguide optical path of the optical package. The multi-component mounting frame comprises first and second frame components that independently fix the relative alignment of the first and second lens components. The first and second frame components are secured to each other such that angular misalignment between the first and second frame components originates along a fixation interface H that is outside of the interfacial waveguide-to-waveguide optical path. The virtual magnified image V and the fixation interface H are both positioned on a common side of the coupling optics, either the laser diode side of the coupling optics or the wavelength conversion device side of the coupling optics.

In accordance with another embodiment, an optical package is provided comprising a first optical waveguide, coupling optics, a second optical waveguide, and a multi-component mounting frame. The first waveguide, coupling optics, and second waveguide are configured to define an interfacial waveguide-to-waveguide optical path extending between opposing input/output facets of the first waveguide and the second waveguide. The coupling optics comprises a first lens component that creates a virtual magnified image V of the waveguide of one of the opposing facets with a magnification factor M1 and a second lens component that creates a focused image of V at the remaining opposing facet with a magnification factor M2. The virtual magnified image V is outside of the interfacial waveguide-to-waveguide optical path. The multi-component mounting frame comprises first and second frame components that independently fix the relative alignment of the first and second lens components. The first and second frame components are secured to each other such that angular misalignment between the first and second frame components originates along a fixation interface H that is outside of the interfacial waveguide-to-waveguide optical path. The virtual magnified image V and the fixation interface H are both positioned on a common side of the coupling optics. In this manner, lateral alignment tolerances are significantly relaxed by executing the final package alignment step at the fixation interface H.

In accordance with yet another embodiment, the coupling optics introduce an optical demultiplication factor into the interfacial waveguide-to-waveguide optical path such that optical misalignment along the fixation interface H generates a demagnified misalignment of the focused image of V by a factor 1/M2.

BRIEF DESCRIPTION OF THE SEVERAL VIEWS OF THE DRAWINGS

The following detailed description of specific embodiments can be best understood when read in conjunction with the following drawings, where like structure is indicated with like reference numerals and in which.

DETAILED DESCRIPTION

Figure 1:
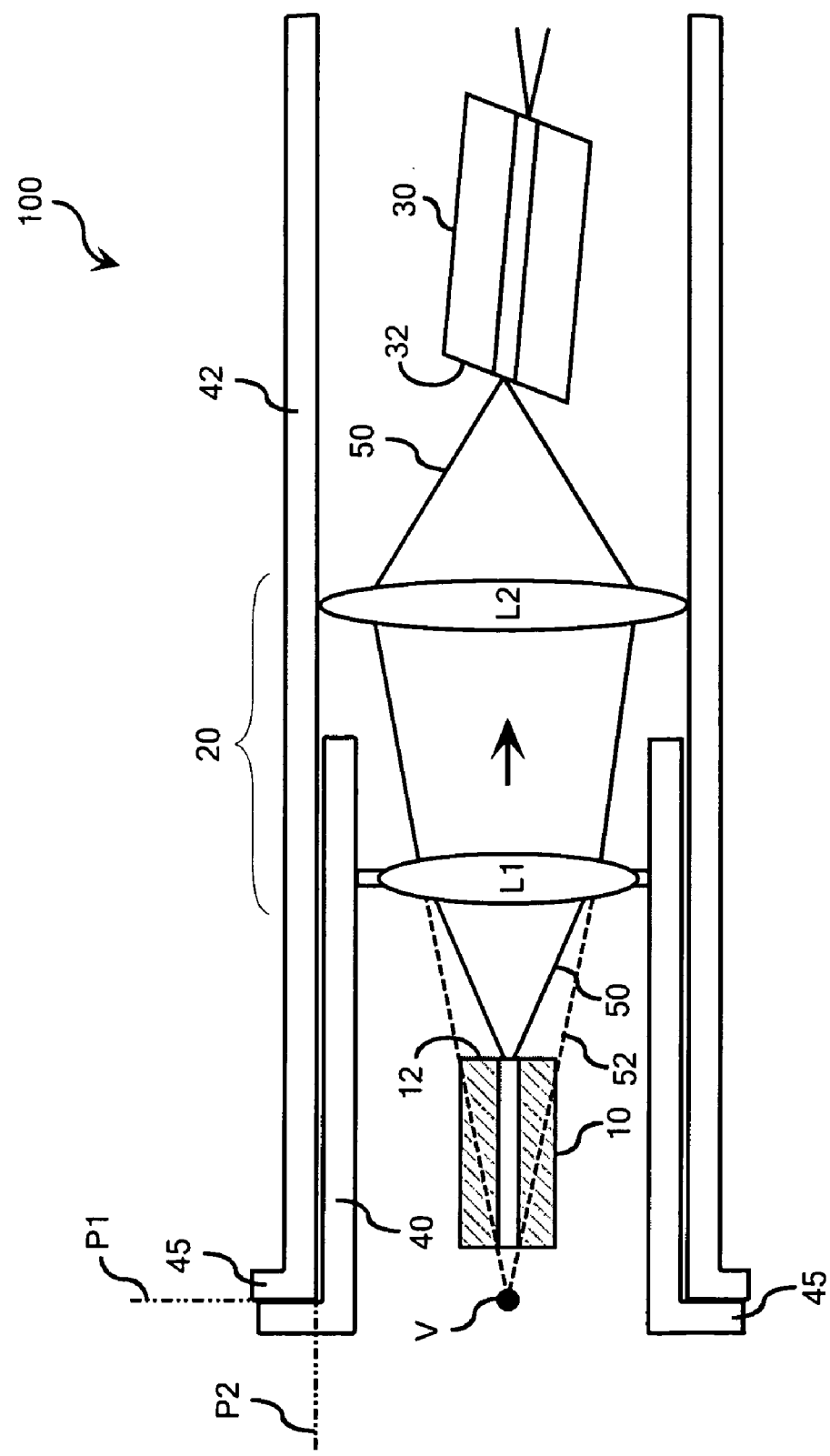
FIG. 1 is a schematic illustration of an optimally-aligned optical package according to one embodiment contemplated by the present disclosure.

Referring initially to FIG. 1, an optical package 100 according to one contemplated embodiment comprises a laser diode 10, coupling optics 20, a wavelength conversion device 30, and a multi-component mounting frame comprising first and second frame components 40, 42. The laser diode 10, coupling optics 20, and wavelength conversion device 30 are configured to define an interfacial waveguide-to-waveguide optical path 50 extending between opposing input/output facets 12, 32 of the laser diode 10 and the wavelength conversion device 30.

The coupling optics 20 comprises first and second lens components L1, L2, one of which creates a virtual magnified image V of the waveguide of one of the opposing facets 12, 32 with a magnification factor M1 and the other of which creates a focused image of V at the remaining opposing facet 12, 32 with a magnification factor M2. In the illustrated embodiment, the virtual magnified image V and the fixation interface H are approximately co-located on the laser diode side of the coupling optics 20 but it is contemplated that the coupling optics 20 could be configured such that V and H would be on the wavelength conversion device side of the coupling optics 20. In either case, the virtual magnified image V and the fixation interface H are outside of the interfacial waveguide-to-waveguide optical path 50 on a common side of the coupling optics 20.

Referring to FIG. 1, the laser diode 10 and the first lens component L1 are both fixed to the first frame component 40. In addition, the wavelength conversion device 30 and the second lens component L2 are fixed to the second frame component 42. Lateral alignment tolerances between the first and second lens components 40, 42 are relaxed by a factor M1, which is derived from the magnification factor of the first lens component L1.

Figure 2:
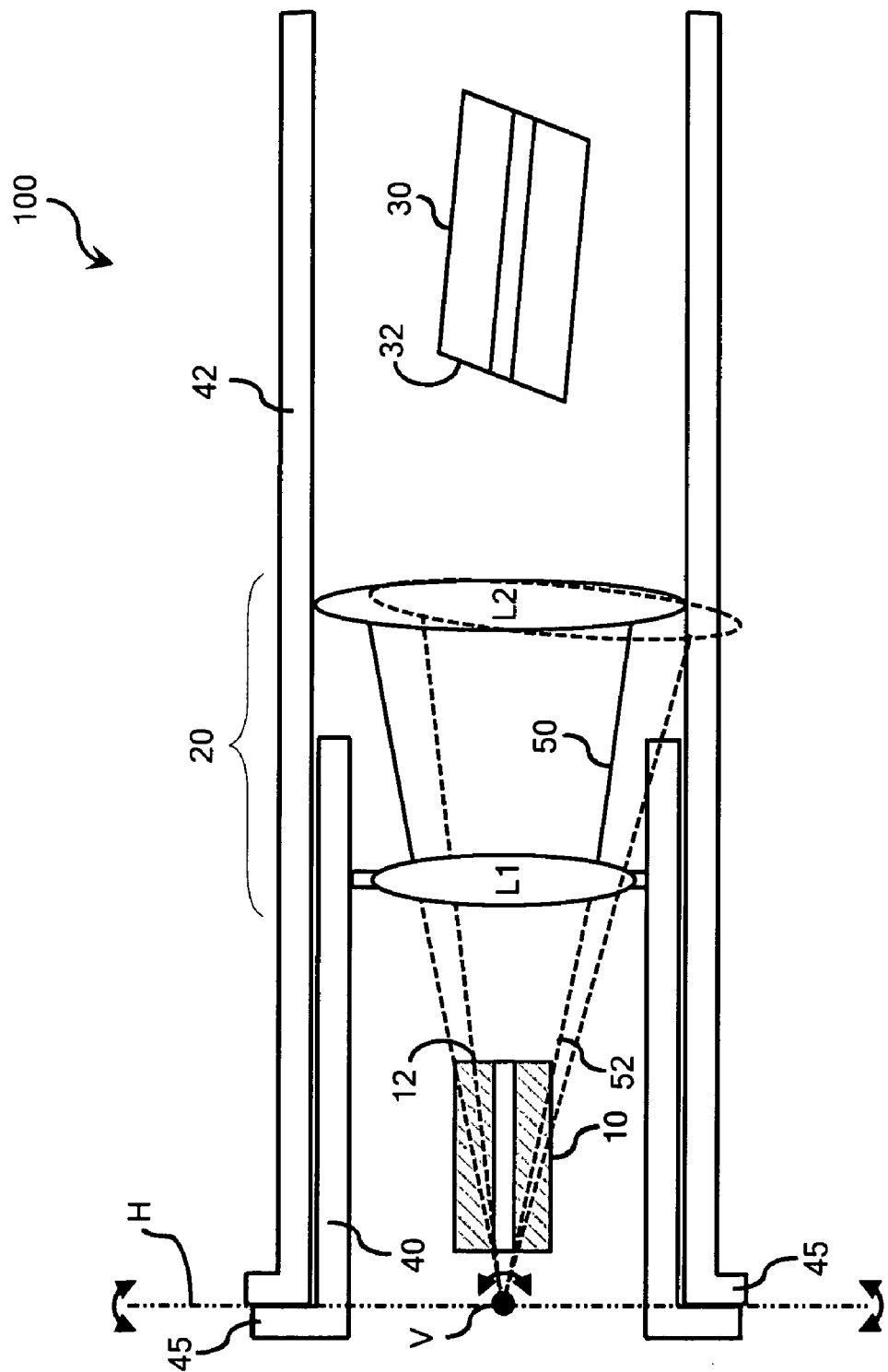
FIG. 2 is a schematic illustration of an angular misalignment in the optical package of FIG. 1.
Figure 3:
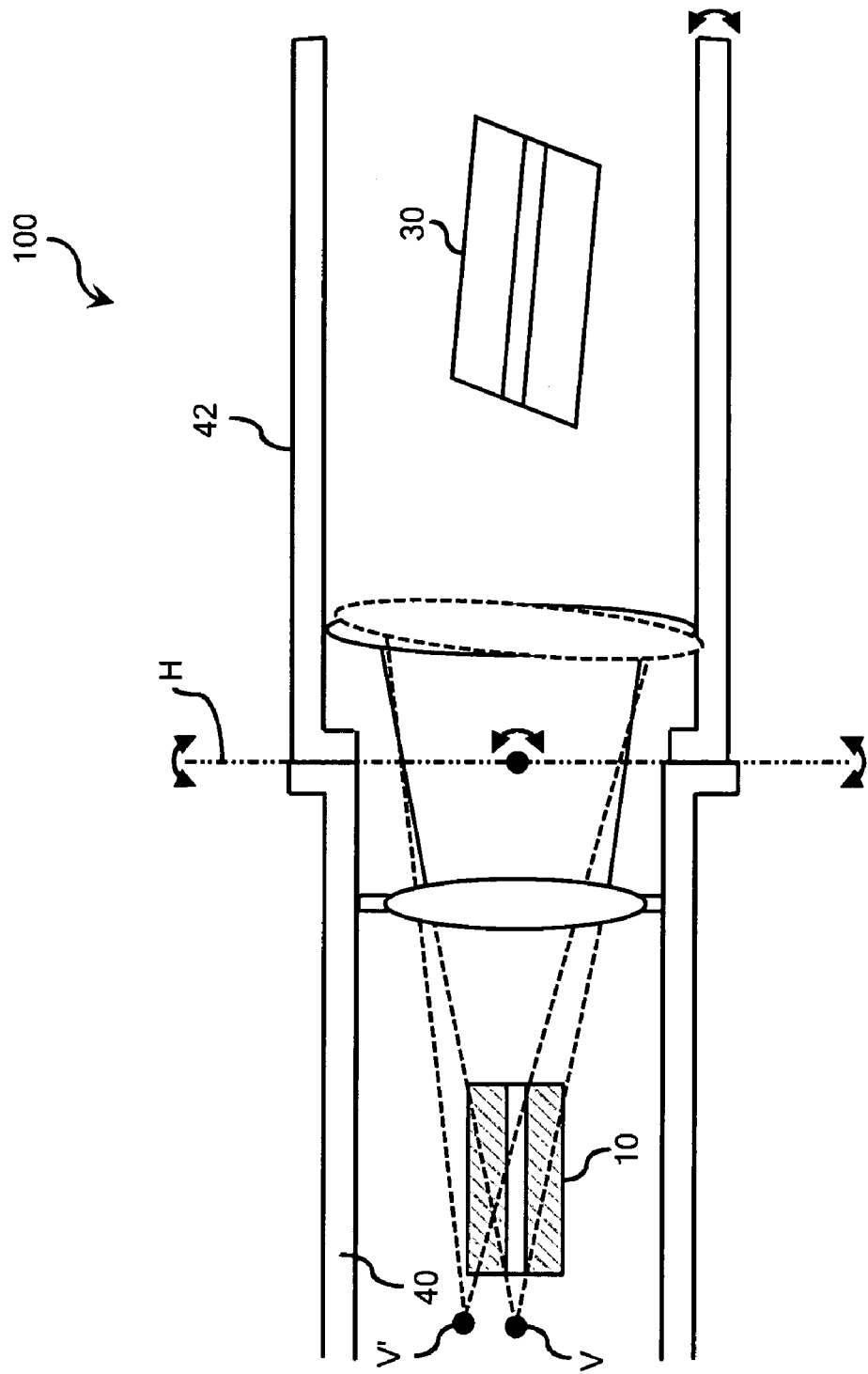
FIG. 3 is a schematic illustration of an angular misalignment in an optical package distinct from that illustrated in FIGS. 1 and 2.

As is illustrated in FIG. 2, the first and second components 40, 42 of the multi-component mounting frame independently fix the relative alignment of the first and second lens components L1, L2 and are secured to each other such that angular misalignment between the first and second frame components 40, 42 originates along a fixation interface H that is in the virtual optical path 52 outside of the interfacial waveguide-to-waveguide optical path 50. In this manner, the aforementioned angular misalignment generates minimal misalignment of the virtual image V to help preserve overall optical integrity of the optical system. In contrast, referring to FIG. 3, where the fixation interface H is in the interfacial waveguide-to-waveguide optical path 50, small angular misalignments between the first and second frame components 40, 42 lead to significant misalignment of the virtual image from the point V to the point V'.

In particular embodiments, the coupling optics 20 may introduce a demultiplication factor into the optical system. For example, where an overall unitary magnification is preferred, the magnification of the coupling optics can be designed to approximate the following relation:

$$(M1)(M2) = -1 \text{ and}$$

$$M2 < 1.$$

In this manner, any optical misalignment along the fixation interface H will generate a demagnified misalignment of the focused image of V by a factor 1/M2. Similar relations can be developed where unitary magnification is not desired.

In any case, the first lens component L1 may comprise a single lens or multiple lenses and the second lens component L2 may comprise a single lens or multiple lenses. In addition, to help eliminate any angular misalignment of the output beam of the laser diode 10 on the waveguide of the wavelength conversion device 30, the coupling optics 20 can be configured such that they are approximately telecentric, an optical configuration in which an image is transferred without bringing it to a focus. When an image of the laser diode output beam is transferred in this manner, if the angular orientation of the output beam is properly aligned in the object plane, it will also be properly aligned in the image plane, independent of any lateral misalignment of the source.

Figure 4:
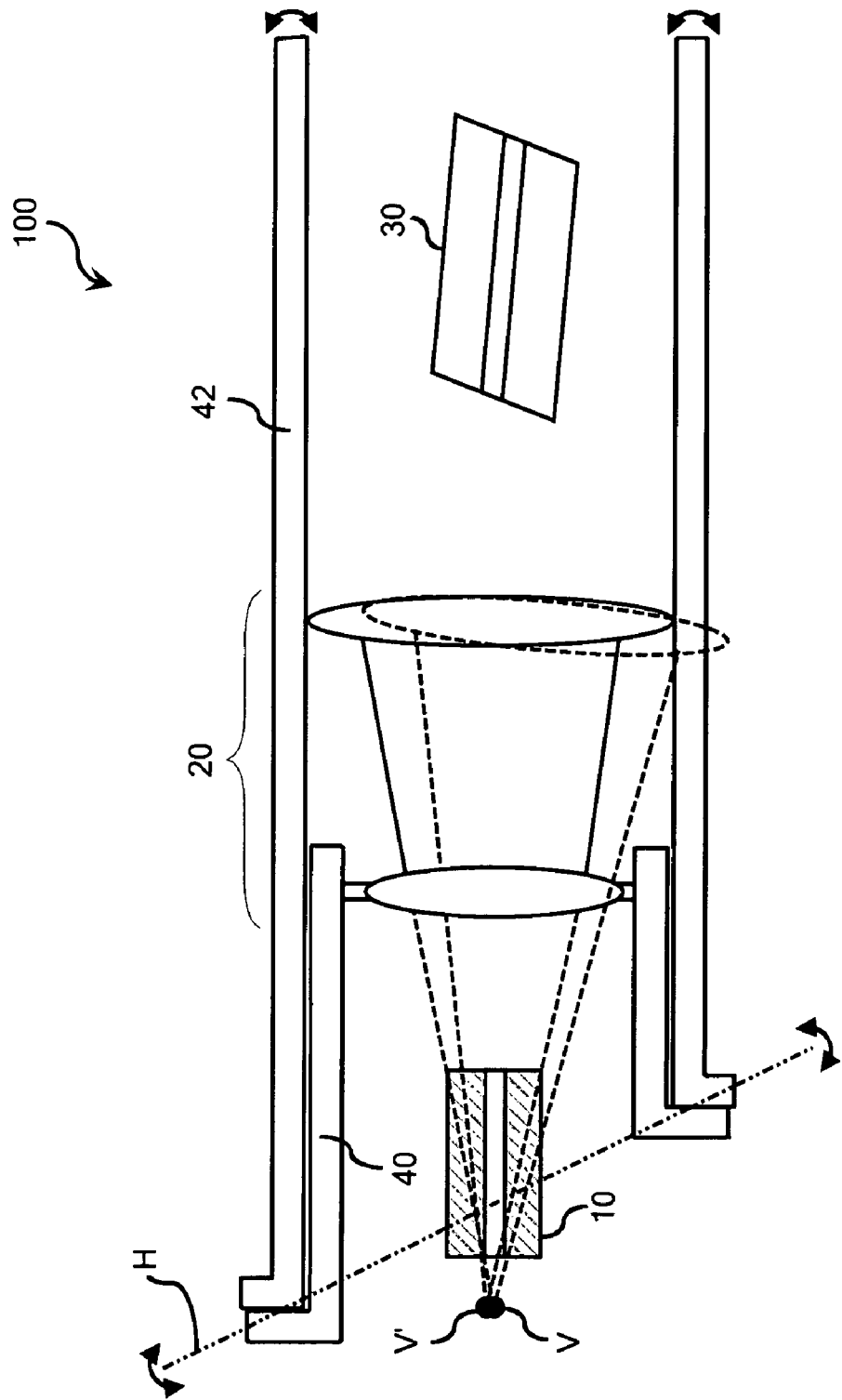
FIG. 4 is a schematic illustration of one of many alternative mounting frame configurations contemplated by the present disclosure.

As is illustrated in FIGS. 1 and 2, the fixation interface H is defined by a pair of intersecting contact planes P1, P2. The first and second frame components 40, 42 are secured to each other along portions of these contact planes P1, P2, for example, via a laser weld. In the secured state, one of the contact planes P1 fixes relative motion of the first and second frame components 40, 42 approximately parallel to the interfacial waveguide-to-waveguide optical path 50. The other contact plane P2 fixes relative motion of the first and second frame components 40, 42 approximately orthogonal to the interfacial waveguide-to-waveguide optical path 50. As is illustrated in FIGS. 2 and 4, the fixation interface H can be orthogonal to the optical path 50 or skewed relative to the optical path 50 and can be configured to directly intersect the position of the virtual image V (see FIG. 2) or be displaced from the position of the virtual image (see FIG. 4). In cases where the fixation interface H is displaced from the position of the virtual image V, some misalignment from V to V' will often need to be tolerated but the misalignment will still be much less that the case illustrated in FIG. 3, where the fixation interface H passes through the interfacial waveguide-to-waveguide optical path 50.

Although the first and second frame components 40, 42 may take a variety of forms, in the illustrated embodiment, they are presented as relatively close-fitting coaxial cylinders. The cylindrical portions of the coaxial cylinders can abut to define the first contact plane P1. The cylinders may be provided with flanged portions 45, which can abut to define the second contact plane P2.

The optical package may also be provided with one or more adaptive actuators for mechanical adjustment of the laser diode 10, the wavelength conversion device 20, or components of the coupling optics 30. During operation of the optical package 100, the adaptive actuators can be used to maximize the wavelength-converted output intensity of the optical package 100 by monitoring the wavelength-converted output intensity of the optical package 100 to correlate particular adjustments along the optical path with an optimum intensity value.

Having described the invention in detail and by reference to specific embodiments thereof, it will be apparent that modifications and variations are possible without departing from the scope of the invention defined in the appended claims. For example, although the concepts of the present disclosure are illustrated with reference to an optical package including relatively simple optical components of relatively straightforward design, it is contemplated that the concepts of the present disclosure may be practiced in a variety of optical packages including those with conventional optical elements arranged in conventional optical configurations, additional or fewer optical elements arranged in new or conventional optical configurations, or novel optical elements introduced to simplify or otherwise improve the illustrated optical configuration. In any case, the concepts described herein should not be limited exclusively to application with the illustrated optical configuration.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the term "approximately" is utilized herein to represent the inherent degree of uncertainty that may be attributed to any quantitative comparison, value, measurement, or other representation. The term is also utilized herein to represent the degree by which a quantitative representation may vary from a stated reference without resulting in a change in the basic function of the subject matter at issue.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

The invention claimed is:

1. An optical package comprising a laser diode, coupling optics, a wavelength conversion device, and a multi-component mounting frame, wherein:
   the laser diode, coupling optics, and wavelength conversion device are configured to define an interfacial waveguide-to-waveguide optical path extending between opposing input/output facets of the laser diode and the wavelength conversion device;
   the coupling optics comprises a first lens component that creates a virtual magnified image V of the waveguide of one of the opposing facets with a magnification factor M1 and a second lens component that creates a focused image of V at the remaining opposing facet with a magnification factor M2;
   the virtual magnified image V is outside of the interfacial waveguide-to-waveguide optical path;
   the multi-component mounting frame comprises first and second frame components that independently fix the relative alignment of the first and second lens components;
   the first and second frame components are secured to each other such that angular misalignment between the first and second frame components originates along a fixation interface H that is outside of the interfacial waveguide-to-waveguide optical path; and
   the virtual magnified image V and the fixation interface H are both positioned on a common side of the coupling optics, either the laser diode side of the coupling optics or the wavelength conversion device side of the coupling optics.

2. An optical package as claimed in claim 1 wherein the virtual magnified image V and the fixation interface H occupy a virtual optical path outside of the interfacial waveguide-to-waveguide optical path.

3. An optical package as claimed in claim 1 wherein the virtual magnified image V and the fixation interface H are approximately co-located.

4. An optical package as claimed in claim 1 wherein:
   the first lens component creates a virtual magnified image V of the output facet of the laser diode;
   the second lens component creates a focused image of V at the input facet of the wavelength conversion device; and
   the respective magnification factors M1 and M2 of the first and second lens components are such that the second lens component introduces a demultiplication factor into the coupling optics.

5. An optical package as claimed in claim 1 wherein:
   the first lens component creates a virtual magnified image V of the input facet of the wavelength conversion device;
   the second lens component creates a focused image of V at the output facet of the laser diode; and
   the respective magnification factors M1 and M2 of the first and second lens components are such that the second lens component introduces a demultiplication factor into the coupling optics.

6. An optical package as claimed in claim 1 wherein the magnification of the coupling optics approximates the following relation:

$$(M1)(M2)=-1.$$

7. An optical package as claimed in claim 1 wherein the magnification of the coupling optics approximates the following relation:

$$(M1)(M2)=-1 \text{ and}$$

$$M2<1.$$

8. An optical package as claimed in claim 1 wherein the coupling optics introduce an optical demultiplication factor into the interfacial waveguide-to-waveguide optical path such that optical misalignment along the fixation interface H generates a demagnified misalignment of the focused image of V by a factor 1/M2.

9. An optical package as claimed in claim 1 wherein the first lens component comprises a single lens or multiple lenses and the second lens component comprises a single lens or multiple lenses.

10. An optical package as claimed in claim 1 wherein the coupling optics are approximately telecentric.

11. An optical package as claimed in claim 1 wherein the fixation interface H is defined by a pair of intersecting contact planes.

12. An optical package as claimed in claim 11 wherein:
   one of the contact planes fixes relative motion of the first and second frame components approximately parallel to the interfacial waveguide-to-waveguide optical path; and
   another of the contact planes fixes relative motion of the first and second frame components approximately orthogonal to the interfacial waveguide-to-waveguide optical path.

13. An optical package as claimed in claim 11 wherein the first and second frame components are secured to each other along at least a portion of at least one of the contact planes.

14. An optical package as claimed in claim 13 wherein the first and second frame components are secured via a laser weld.

15. An optical package as claimed in claim 1 wherein the first and second frame components comprise coaxial cylinders.

16. An optical package as claimed in claim 1 wherein the first and second frame components comprise flanged coaxial cylinders.

17. An optical package as claimed in claim 16 wherein:
cylindrical portions of the coaxial cylinders abut to define a first contact plane of the fixation interface H;
flanged portions of the coaxial cylinders abut to define a second contact plane of the fixation interface H; and
the first and second contact planes intersect.

18. An optical package as claimed in claim 17 wherein:
the first contact plane fixes relative motion of the first and second frame components approximately orthogonal to the interfacial waveguide-to-waveguide optical path; and
the second contact plane fixes relative motion of the first and second frame components approximately parallel to the interfacial waveguide-to-waveguide optical path.

19. An optical package comprising a laser diode, coupling optics, a wavelength conversion device, and a multi-component mounting frame, wherein:
the laser diode, coupling optics, and wavelength conversion device are configured to define an interfacial waveguide-to-waveguide optical path extending between opposing input/output facets of the laser diode and the wavelength conversion device;
the coupling optics comprises a first lens of magnification factor M1 and a second lens component of magnification factor M2;
the multi-component mounting frame comprises first and second frame components that independently fix the relative alignment of the first and second lens components;
the first and second frame components are secured to each other such that angular misalignment between the first and second frame components originates along a fixation interface H that is outside of the interfacial waveguide-to-waveguide optical path;
the fixation interface H is positioned on one side of the coupling optics, either the laser diode side of the coupling optics or the wavelength conversion device side of the coupling optics; and
the coupling optics introduce an optical demultiplication factor into the interfacial waveguide-to-waveguide optical path such that optical misalignment along the fixation interface H generates a demagnified misalignment of the focused image of V by a factor 1/M2.

20. An optical package comprising a first optical waveguide, coupling optics, a second optical waveguide, and a multi-component mounting frame, wherein:
the first waveguide, coupling optics, and second waveguide are configured to define an interfacial waveguide-to-waveguide optical path extending between opposing input/output facets of the first waveguide and the second waveguide;
the coupling optics comprises a first lens component that creates a virtual magnified image V of the waveguide of one of the opposing facets with a magnification factor M1 and a second lens component that creates a focused image of V at the remaining opposing facet with a magnification factor M2;
the virtual magnified image V is outside of the interfacial waveguide-to-waveguide optical path;
the multi-component mounting frame comprises first and second frame components that independently fix the relative alignment of the first and second lens components;
the first and second frame components are secured to each other such that angular misalignment between the first and second frame components originates along a fixation interface H that is outside of the interfacial waveguide-to-waveguide optical path; and
the virtual magnified image V and the fixation interface H are both positioned on a common side of the coupling optics.

* * * * *